United States Patent [19]

Kim et al.

[11] 4,337,475
[45] Jun. 29, 1982

[54] HIGH POWER TRANSISTOR WITH HIGHLY DOPED BURIED BASE LAYER

[75] Inventors: Choong-Ki Kim; Tae-Kyun Kwak; Seong-Hyeon Choe, all of Seoul, Rep. of Korea

[73] Assignee: Gold Star Semiconductor, Ltd., Seoul, Rep. of Korea

[21] Appl. No.: 49,053

[22] Filed: Jun. 15, 1979

[51] Int. Cl.$^3$ .................. H01L 29/72; H01L 29/06
[52] U.S. Cl. .................................. 357/36; 357/20; 357/89
[58] Field of Search .................. 357/20, 36, 89

[56] References Cited

U.S. PATENT DOCUMENTS

| | | | |
|---|---|---|---|
| 3,390,025 | 6/1968 | Strieter | 357/36 |
| 3,489,964 | 1/1970 | Masuda | 357/36 |
| 3,582,726 | 6/1971 | Gilbert et al. | 357/36 |
| 3,704,177 | 11/1972 | Beale | 357/89 |
| 3,922,706 | 11/1975 | Kaiser | 357/36 |

*Primary Examiner*—Gene M. Munson
*Attorney, Agent, or Firm*—Wenderoth, Lind & Ponack

[57] ABSTRACT

A novel diffusion type transistor which is useful for relatively high-power and high-current applications and a method for manufacturing the transistor are disclosed.

In constructing the transistor, the base under emitter has three zones, one of which is a buried layer such as used in the fabrication of bipolar integrated circuits. Two of the zones, including the buried layer base zone, are highly doped to provide a low resistivity base current path. The last zone is a low impurity concentration epitaxially grown base zone and which accepts and transports the injected minority carriers from the emitter to the collector. Hence, the emitter periphery is determined by the sum of the total PN junction boundary between the buried layer base zone, the epitaxially grown base zone and a diffused emitter.

The phenomenon of current crowding at the emitter periphery is reduced by an increase in emitter periphery for the same chip size and by a reduction in the potential gradient caused by the lateral base current due to the lowered resistivity of the highly doped base zones.

1 Claim, 6 Drawing Figures

HIGH POWER TRANSISTOR WITH HIGHLY DOPED BURIED BASE LAYER

BACKGROUND OF THE INVENTION

The present invention relates generally to semiconductor devices which handle relatively high-power and/or high current.

The most important phenomena which occurs at high-current levels is current crowding, that is, the crowding of the injected current toward the rim or the periphery of the emitter. The crowding of the injected current toward the rim of the emitter occurs primarily because a lateral potential gradient within the base layer is produced by the base current.

Consider the operation of a convention planar transistor such as illustrated in FIG. 1. FIG. 1 shows a cross-sectional view of a typical transistor structure such as produced by conventional methods. Regions of different conductivity type are labelled. The transistor comprises an N-type emitter region 11, a P-type base region 12, an N-type collector region 13, emitter ohmic contact 14 and base ohmic contact 15. It is to be understood that NPN and PNP structures are substantially equivalent in operation, and either may be employed. Since the base region 12 has a non-zero resistance and the base current 16 flows laterally within base region 12, a potential gradient is produced by the base current 16. Considering the polarity of the potential drop within base region 12, it becomes apparent that the rim 17 of the emitter region 11 is more forward-biased than the center 18 of the emitter region 11. This potential drop is not very large, but, since the injection increases exponentially with the voltage, its effect is magnified at high voltages. Hence, the emitter current is concentrated in a smaller area, i.e., the current density is larger at the rim 17. As a result, the rim 17 becomes hotter than center 18 due to the concentration of current carriers, reducing the power handling capacity of the transistor.

High power output transistors are therefore constructed in such a way to maximize the emitter periphery. Conventional power transistor design which aims to increase the emitter periphery is accompanied by an increase in the emitter area, the final chip size and, as a result, the chip cost.

OBJECT OF THE INVENTION

It is the general object of the present invention to provide a transistor having a high current handling capacity with a smaller chip size as compared to the conventional power transistor design.

Another object of the invention is to provide a method of manufacturing a transistor having a long emitter periphery wherein the accompanying increase in emitter area is substantially reduced or eliminated.

Still another object of the invention is to provide an economical method of manufacturing a transistor having a large current handling capacity by reducing the chip size.

Various other objects and advantages of the present invention will become clear from the following description of the novel features of the preferred embodiments thereof in connection with the accompanying drawings.

SUMMARY OF THE INVENTION

In essence, the foregoing objects are achieved by providing a base with three zones. The most significant role of the first two zones is to provide low resistivity conduction paths for the base current and the main role of the third zone is to accept and transport the injected minority carriers from the emitter to the collector. Hence, the low resistivity base zones reduce the base spreading resistance ($r_{bb'}$) and the high resistivity base zone improves the emitter injection efficiency with immunity to current crowding.

This is accomplished by constructing the base region in three processing steps. The first step is similar to the buried layer diffusion step used in the fabrication of bipolar integrated circuits. The buried layer base zone must have a low resistivity. The second step is epitaxial growth of the high resistivity zone. The third step is diffusion of impurities from the front side of the wafer to provide a low resistivity conducting path to the buried layer base zone.

The geometry and relative configuration of the first and third zones of the base relative to the emitter are very important. In addition, the emitter injection efficiency of minority carriers is not affected by the impurity concentration of the first and third zones of the base, since it is dependent on the relative concentration ratios of the epitaxial base zone and the emitter.

With the present invention, the buried layer base can reduce the chip size required to achieve the same emitter periphery from that required of conventional structures. For example, a conventional high-current transistor that requires a 200 by 200 mil chip to achieve a 10 cm periphery can be redesigned employing the buried layer base of the present invention on a 120 by 120 mil chip maintaining the same periphery. This reduction in device size permits two or three times as many chips to be produced on a single wafer. Moreover, a reduced base spreading resistance ($r_{bb'}$), an improved frequency range, an improved emitter injection efficiency and an improved gain factor are also achieved.

BRIEF DESCRIPTION OF THE DRAWINGS

Reference will herein be made to the accompanying drawings wherein.

It is to be understood that the drawings are simplified schematic views which are not true to scale for better illustration of the best mode of carrying out the invention.

DETAILED DESCRIPTION OF PREFERRED EMBODIMENT

Figure 1:
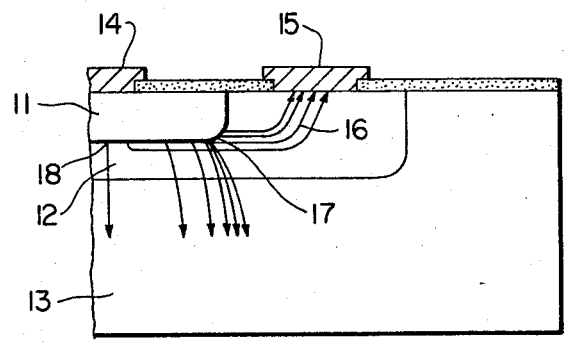
FIG. 1 is a cross-sectional diagram of a typical known planar diffused transistor and with a schematic illustration of its current distribution.
Figure 2:
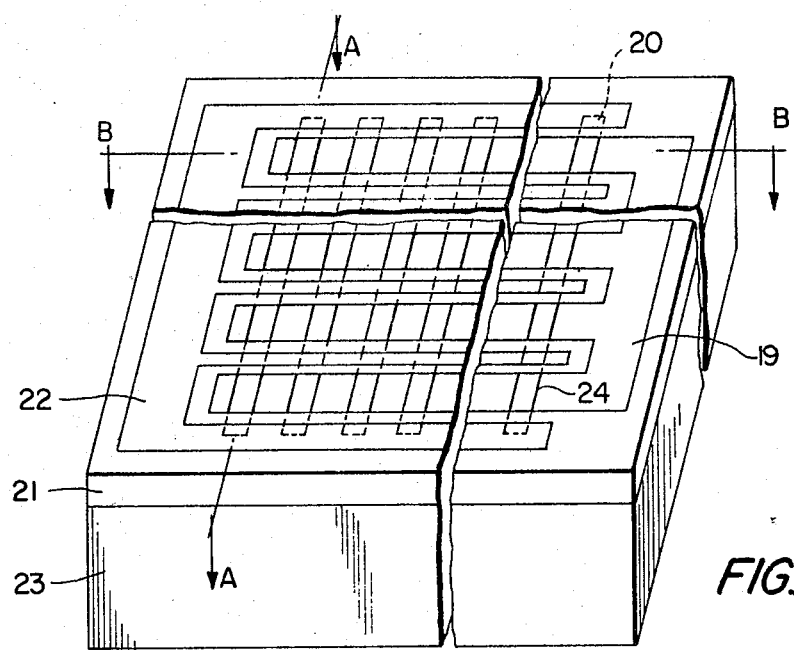
FIG. 2 is an example of the transistor in accordance with the present invention.

Referring now to FIG. 2, an example of the present invention is shown in a schematic view which omits the emitter and base ohmic contacts for the sake of simplicity. In FIG. 2, substrate 23 having a first conductivity type is used as a collector. A slice of a single crystal silicon having a bulk resistivity of 30–100 ohm-cm, is employed as a substrate 23. It is to be understood that FIGS. 2–6 show a single device, but that several hundred or thousand identical devices are produced in a single wafer simultaneously.

Referring again to FIG. 2, 19 represents the diffused emitter of the first conductivity type and 20–22 represent the base of the opposite conductivity type. In the base 20–22, it is noted that 20 is the buried layer base whose impurity concentration is very high; 21 is the epitaxially grown base whose impurity concentration is very low having an average resistivity of 1–5 ohm-cm to improve the emitter injection efficiency; and 22 is the diffused base with a high impurity concentration. In the deposition and diffusion of the impurity materials into regions 19, 20 and 22, the geometry and relative locations of these regions are very important, but the means by which they are achieved is not critical.

Figure 3:
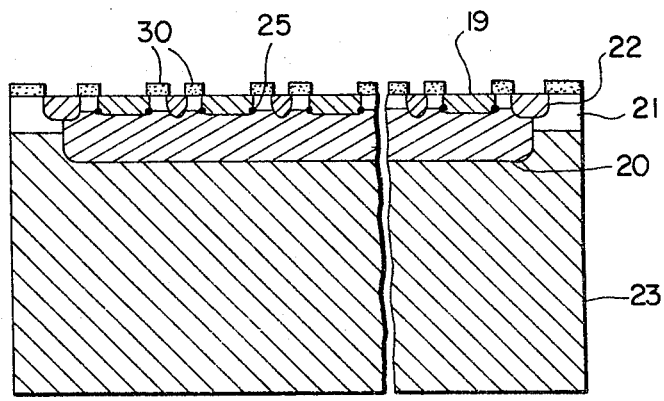
FIG. 3 is a cross-sectional diagram taken along the line A—A of FIG. 2.
Figure 4:
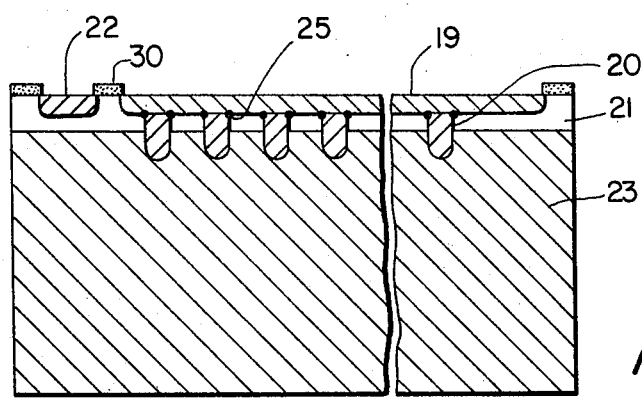
FIG. 4 is a cross-sectional diagram taken along the line B—B of FIG. 2.

Understanding of the present invention will be further facilitated by referring to FIGS. 3 and 4, which are cross-sectional diagrams of FIG. 2. FIG. 3 is a cross-sectional diagram taken along the line A—A of FIG. 2 and FIG. 4 is a cross-sectional diagram taken along the line B—B of FIG. 2.

Figure 5:
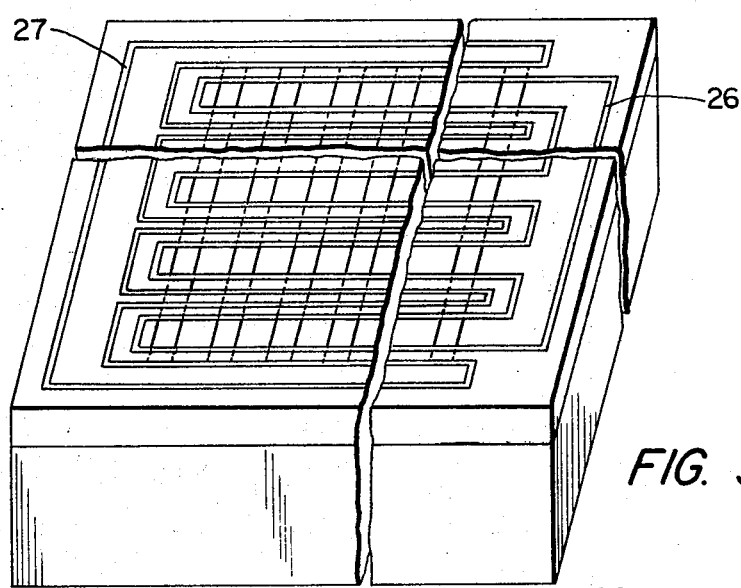
FIG. 5 is a view of the transistor in FIG. 2 with emitter and base ohmic contacts.

The high power transistor of the present invention as illustrated in FIGS. 2 to 4 is formed as follows. First an impurity which causes the opposite conductivity type as the conductivity type of substrate 23 is diffused into substrate 23 to form diffusion base zone 20. Note in FIGS. 2 and 4 that base zone 20 may be provided in a plurality of parallel strips by any known method, such as masking or selective diffusion. This construction technique is desirable to maximize the periphery. The impurity concentration in base zone 20 should be high in order to obtain a low resistivity zone. Next base zone 21 is epitaxially grown on the entire upper surface of substrate 23 thereby completely burying base zone 20. Epitaxially grown base zone 21 has the same conductivity type as base zone 20, of course, but has a lower impurity concentration in order to form a zone of high resistivity. Next base zone 22 is formed by diffusing addition impurities which cause the opposite conductivity type as the conductivity type of substrate 23 into epitaxially grown base zone 21. Note in FIG. 2 that this base zone 22 may have a comb shape with the teeth extending perpendicular to the plurality of strips of base zone 20. Any known semiconductor construction technique for achieving this shape for base zone 22 may be employed. Note, as clearly illustrated in FIG. 3, that the base zone 22 extends completely through epitaxially grown base zone 21 to contact the base zone 20. The base zone 22 should have a high impurity concentration for forming a region of low resistivity. Emitter 19 is then formed by diffusing impurities of the same conductivity type as the conductivity of substrate 23 into epitaxially grown base zone 21. As illustrated in FIG. 2, emitter 19 may also have a comb shape with the teeth interleaved with but not intersecting the teeth of the comb shape of base zone 22. Note that FIGS. 3 and 4 clearly illustrate that emitter 19 extends completely through epitaxially grown base zone 11 to contact base zone 20 and form a PN junction therewith. Of course, a PN junction is also formed wherever emitter 19 and base zone 21 contact. Next the exposed surface of the PN junction between emitter 19 and base zone 21 is covered with a passivating oxide film 30 as illustrated in FIGS. 3 and 4. Lastly ohmic contacts are attached to collector substrate 23, emitter 19 and base zone 22. It is preferred that emitter ohmic contact 26 be placed upon most of the exposed surface of emitter 19 and that base ohmic contact 27 be placed upon most of the exposed surface of base zone 22 as illustrated in FIG. 5. The collector ohmic contact may be of conventional construction and illustration thereof is omitted for the sake of brevity.

The three base zones in the high power transistor of the present invention contribute to be advantageous reduction of current crowding. Base zones 20 and 22 carry most of the lateral base current due to their low resistivity. In addition, the low resistivity of base zones 20 and 22 serves to reduce the potential gradient in the base caused by the lateral base current. As a result of this decreased potential gradient the emitter-base current is more evenly distributed over the emitter-base junction thereby reducing the current density at the periphery of the emitter-base junction. At the same time the minority carrier injection efficiency is not degraded by the low resistivity base zones 20 and 22 because this factor is determined by the relative impurity concentration ratios of the emitter 19 and the high resistivity epitaxially grown base zone 21.

Regarding the operation of the present invention, the emitter periphery is determined by the sum of the total PN junction boundary between the buried layer base 20, the epitaxially grown base 21 and the diffused emitter 19. In other words, the emitter periphery is determined by the cumulative sum of the bold-line sections 24 in FIG. 2 and by the cumulative sum of the dots 25 in FIGS. 3 and 4. The construction illustrated in FIG. 2 in which the teeth of comb shape emitter 19 intersect the plurality of strips forming base zone 20 at right angles serves to increase the emitter periphery. This construction thus serves to further reduce the current density at the emitter periphery. Hence, if the resistivity and relative location of emitter 19 and base zones 20 and 22 are properly selected and the voltage drop produced by the base current and $r_{bb'}$ does not exceed the critical voltage drop for the onset of current crowding of 2 $kT/q$ volts, then the phenomena of current crowding can be eliminated.

Figure 6:
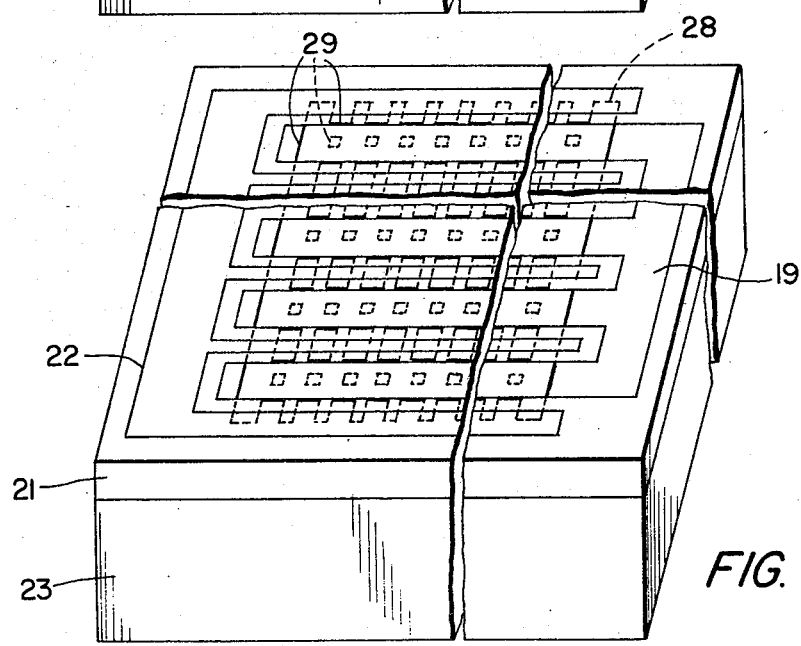
FIG. 6 is another example of the transistor in accordance with the present invention.

FIG. 6 is a schematic view of another example of the present invention. In FIG. 6, the emitter 19 and the base 21, 22 have the same configuration as in FIG. 2, except that the buried layer base 28 has a mesh geometry to further increase the emitter periphery for a given emitter area. Since, in FIG. 6, the emitter periphery is determined by the cumulative sum of the bold-line sections 29, favorable ratios of emitter periphery to emitter area and emitter periphery to base area are obtained together with the ease of manufacture, reliability and improved characteristics of the device.

It has been stated hereinabove and it is well recognized in the art that conductivity types are interchangeable, i.e., that a PNP device is the full equivalent of an NPN device having the same geometry, dopant levels, etc.. The present invention has the same effect of PNP devices as it does on NPN devices, on mesa transistors as on planar transistors, also on discrete devices as on integrated circuits, and the invention may find even broader application with the common aim of reducing the manufacturing cost.

In all of the foregoing examples, other device properties are not affected. Particularly, the breakdown voltage $BV_{CBO}$ is unaffected since it is generally a function of resistivity on the lightly doped side.

Various changes in the details, steps, materials and arrangements of parts, which have been herein described and illustrated to explain the nature of the invention, may be made by those skilled in the art within the principle and scope of the invention as defined in the appended claims.

What is claimed is:

1. A semiconductor device comprising:
   a collector substrate having a first type conductivity;
   a base having a second type conductivity including a low resistivity first base zone adjacent to and partially buried within said collector substrate, a high resistivity second base zone adjacent to said collector substrate and adjacent to and covering said first base zone except for at least one first opening therein and at least one second opening therein, and a low resistivity third base zone adjacent to said second base zone and adjacent to said first base zone through said at least one first opening in said second base zone; and
   an emitter having a first type conductivity adjacent to said second base zone and adjacent to said first base zone through said at least one second opening in said second base zone;
   wherein:
   said first base zone has a mesh shape including a plurality of first parallel strips and a plurality of second parallel strips perpendicular to said first parallel strips;
   said third base zone has a comb shape, the teeth of said comb shape being disposed perpendicular to said first parallel strips of said first base zone;
   said emitter has a comb shape, the teeth of said comb shape being disposed parallel to and aligned with said second parallel strips of said first base zone and interleaved with but not adjoining said teeth of said third base zone; and
   said second base zone has a plurality of first openings disposed at the crossings of said first parallel strips of said first base zone and said teeth of said third base zone and has a plurality of second openings disposed between said second parallel strips of said first base zone and said teeth of said emitter.

* * * * *